United States Patent
Endoh

(10) Patent No.: US 10,101,589 B2
(45) Date of Patent: Oct. 16, 2018

(54) OPTICAL ELEMENT, DISPLAY DEVICE, MASTER, AND METHOD FOR MANUFACTURING OPTICAL ELEMENT

(71) Applicant: c/o DEXERIALS CORPORATION, Tokyo (JP)

(72) Inventor: Sohmei Endoh, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 225 days.

(21) Appl. No.: 14/946,359

(22) Filed: Nov. 19, 2015

(65) Prior Publication Data

US 2016/0178913 A1     Jun. 23, 2016

(30) Foreign Application Priority Data

Dec. 15, 2014   (JP) .................. 2014-253174

(51) Int. Cl.
| | |
|---|---|
| G02B 27/09 | (2006.01) |
| G03F 7/00 | (2006.01) |
| G03F 7/20 | (2006.01) |
| G03F 7/32 | (2006.01) |
| G02B 3/00 | (2006.01) |
| G02B 5/02 | (2006.01) |

(52) U.S. Cl.
CPC ....... *G02B 27/0927* (2013.01); *G02B 3/0025* (2013.01); *G02B 3/0031* (2013.01); *G02B 3/0043* (2013.01); *G02B 5/0284* (2013.01); *G02B 5/0294* (2013.01); *G02B 27/0961* (2013.01); *G02B 27/0983* (2013.01); *G03F 7/0005* (2013.01); *G03F 7/2053* (2013.01); *G03F 7/32* (2013.01)

(58) Field of Classification Search
CPC ............ G02B 27/0927; G02B 27/0961; G02B 27/0983; G03F 7/0005; G03F 7/2053; G03F 7/32
USPC ........................................................ 359/627
See application file for complete search history.

(56) References Cited

FOREIGN PATENT DOCUMENTS

| | | |
|---|---|---|
| JP | 2005-119940 A | 5/2005 |
| JP | 2006-323337 A | 11/2006 |
| JP | 2007-517254 A | 6/2007 |
| JP | 2007-183498 A | 7/2007 |
| JP | 2008-307852 A | 12/2008 |
| JP | 2009-521342 A | 6/2009 |
| JP | 2014-038314 A | 2/2014 |
| JP | 2014-510952 A | 5/2014 |

OTHER PUBLICATIONS

Jul. 3, 2018, Japanese Office Action issued for related JP application No. 2014-253174.

*Primary Examiner* — Jack Dinh
(74) *Attorney, Agent, or Firm* — Paratus Law Group, PLLC

(57) ABSTRACT

There is provided an optical element including: a substrate; and a plurality of microlenses formed on the substrate. A reflecting surface of the microlens is an aspherical surface and asymmetrical with respect to an optical axis of the microlens. A pitch between adjacent ones of the microlenses is 10 to 230 μm. A depth of the microlens is 3.2 to 15.4 μm.

14 Claims, 18 Drawing Sheets

OPTICAL ELEMENT, DISPLAY DEVICE, MASTER, AND METHOD FOR MANUFACTURING OPTICAL ELEMENT

CROSS REFERENCE TO RELATED APPLICATION(S)

This application is based upon and claims benefit of priority from Japanese Patent Application No. 2014-253174, filed on Dec. 15, 2014, the entire contents of which are incorporated herein by reference.

BACKGROUND

The present invention relates to an optical element, a display device, a master, and a method for manufacturing an optical element.

JP 2006-323337A, JP 2007-183498A, JP 2007-517254T, and JP 2009-521342T disclose a microlens array element including a plurality of microlenses. The microlens array element is an element in which a large number of microlenses of micron order are formed on a substrate. The microlens array element has the property of making it difficult for light to be diffused. Hence, the microlens array element is disposed as a diffraction grating filter on a backlight of a liquid crystal display, for example. Thereby, the front brightness of the liquid crystal display is improved. As other uses, various optical communication optical parts, focusing glasses of cameras, solar cells, etc. are known.

In the microlens array element disclosed in JP 2006-323337A, the diameter of the microlens is set to 10 to 20 μm. In JP 2006-323337A, microlenses are arranged randomly.

JP 2007-183498A discloses a microlens array element in which the intensity distribution of the reflected light forms a top hat shape. JP 2007-517254T and JP 2009-521342T disclose a microlens array element in which the reflecting surface is an aspherical surface.

SUMMARY

However, in all the microlens array elements, the optical properties, in particular the reflection properties and the color unevenness properties, have not been sufficient. Thus, it is desirable to provide a novel improved optical element, a display device, a master, and a method for manufacturing an optical element which make it possible to improve the optical properties.

According to an aspect of the present invention, there is provided an optical element including: a substrate; and a plurality of microlenses formed on the substrate. A reflecting surface of the microlens is an aspherical surface and asymmetrical with respect to an optical axis of the microlens. A pitch between adjacent ones of the microlenses is 10 to 230 μm. A depth of the microlens is 3.2 to 15.4 μm.

An outer edge of the microlens may be in contact with an outer edge of another microlens.

The pitch between adjacent ones of the microlenses may be different between combinations of adjacent ones of the microlenses.

The depth of the microlens may be different between microlenses.

An aperture plane of the microlens may be in a shape deviated from a regular polygon.

The aperture plane of the microlens may be in a shape deviated from a regular hexagon.

The aperture plane of the microlens may be in a shape deviated from a square.

An arithmetic average roughness Ra of the reflecting surface of the microlens may be 27 nm or less.

An amount of shift of the optical axis of the microlens from a centroid of the microlens may be 2.5% to 15% of a radius of the microlens.

An intensity distribution of reflected light may form a top hat shape.

A sum of intensities of the reflected light may be 4% or less of an intensity of incident light.

According to another aspect of the present invention, there is provided a display device including the above optical element.

According to another aspect of the present invention, there is provided a master for manufacturing the above optical element, the master including: a base material for the master; and a resist layer formed on the base material for the master. A plurality of transfer units each having an inverted shape of the microlens are formed on the resist layer.

According to another aspect of the present invention, there is provided a method for manufacturing an optical element for manufacturing the above optical element, the method including: forming a resist layer on a base material for a master; pulse-applying laser light to the resist layer to form a latent image pattern having an inverted shape of the microlens on the resist layer; developing the resist layer to form a transfer unit having the inverted shape of the microlens on the resist layer; and transferring the inverted shape of the transfer unit to a substrate.

In the optical element according to the aspect, since the microlens has the shape described above, the optical properties are improved. In particular, the intensity distribution of the reflected light forms a top hat shape, and color unevenness is hardly found.

As described above, according to the aspects of the present invention, since the microlens has the shape described above, the optical properties are improved.

DETAILED DESCRIPTION OF THE EMBODIMENT(S)

Figure 1:
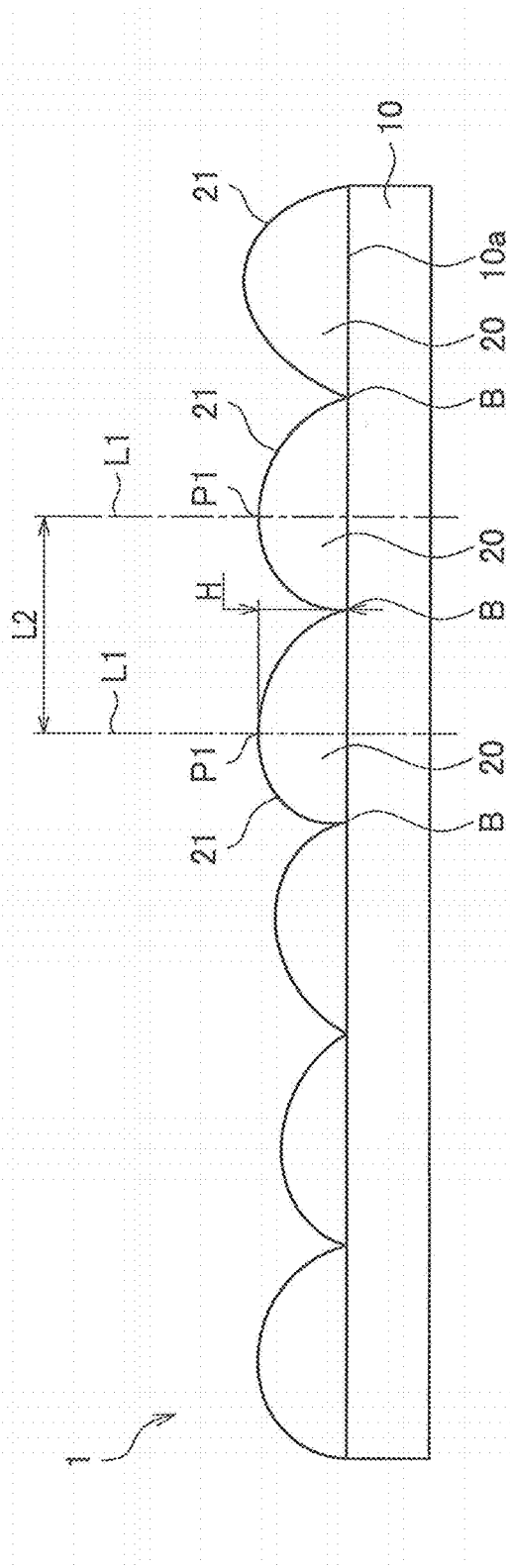
FIG. 1 is a cross-sectional view showing the configuration of an optical element according to an embodiment of the present invention.

Hereinafter, referring to the appended drawings, preferred embodiments of the present invention will be described in detail. It should be noted that, in this specification and the appended drawings, structural elements that have substantially the same function and structure are denoted with the same reference numerals, and repeated explanation thereof is omitted.

<1. Configuration of the Optical Element>

Figure 2:
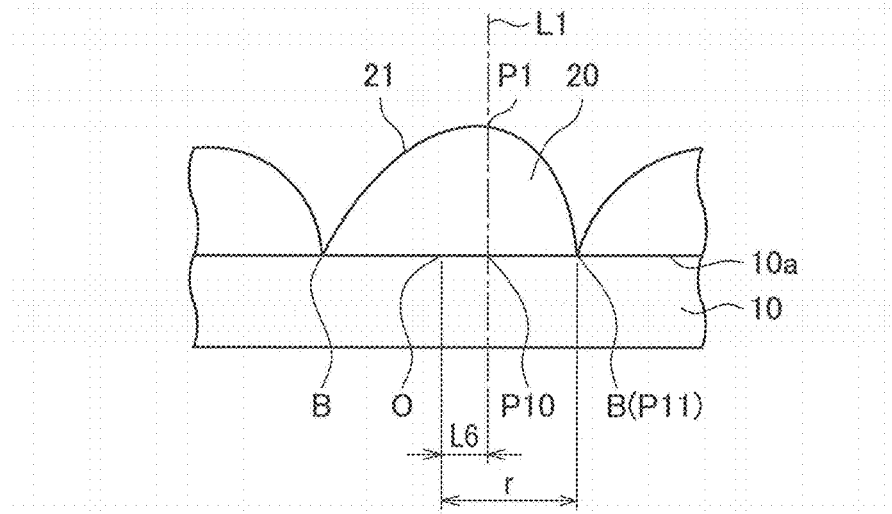
FIG. 2 is an enlarged cross-sectional view of the microlens.
Figure 3:
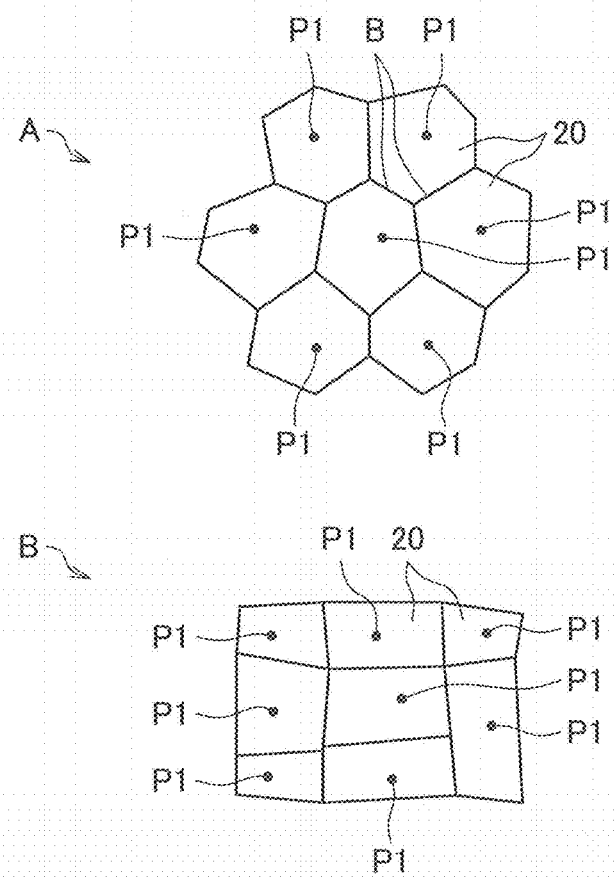
FIG. 3 include planar views showing examples of the shape of the aperture plane of the microlens.

First, the configuration of an optical element 1 according to the embodiment is described on the basis of FIG. 1 to FIG. 3. As shown in FIG. 1, the optical element 1 includes a substrate 10 and a plurality of microlenses 20. The cross section of FIG. 1 is a perpendicular cross section that passes through the apices P1 of at least two microlenses 20 and 20 and is perpendicular to the surface 10a of the substrate 10.

The substrate 10 is a rectangular resin sheet, for example, and a plurality of microlenses 20 are formed on the surface 10a of the substrate 10.

The plurality of microlenses 20 are formed on the surface 10a of the substrate 10. The microlens 20 may be either a convex lens or a concave lens. It is also possible for concave lenses and convex lenses to coexist. In FIG. 1, the microlens 20 is a convex lens. Each microlens 20 has a distorted shape. Specifically, the reflecting surface 21 of the microlens 20 is an aspherical surface and is asymmetrical with respect to the optical axis L1. Here, the optical axis L1 is an axis that passes through the apex P1 of the microlens 20 and is perpendicular to the surface 10a. Here, when the microlens 20 is a convex lens, the apex P1 is the point farthest from the surface 10a of the substrate 10 out of the points on the reflecting surface 21. On the other hand, when the microlens 20 is a concave lens, the apex P1 is the point nearest to the surface 10a of the substrate 10 out of the points on the reflecting surface 21. Here, the microlenses 20 preferably have shapes different from each other. In this case, the optical properties are further improved. The microlenses 20 shown in FIG. 1 have shapes different from each other.

The pitch of the microlenses 20 is a value in a range of 10 to 230 μm. Here, the pitch is the distance L2 between the optical axes L1 of adjacent microlenses 20. In the embodiment, "adjacent" is used in a meaning that permits a space (flat portion) to exist between microlenses 20. However, as described later, a flat portion preferably does not exist. When the microlenses 20 have shapes different from each other, the pitch may take various values in a range of 10 to 230 μm for combinations of microlenses 20. Thereby, the optical properties of the optical element are improved.

The depth (height) of the microlens 20 is a value in a range of 3.2 to 15.4 μm. The lower limit of the depth is preferably 7.5 μm. Here, the depth of the microlens 20 is shown by the optical axis direction distance H from the apex P1 of the microlens 20 to the outer edge B. The outer edge B is the portion nearest to the surface 10a of the substrate 10 out of the portions on the reflecting surface 21 of the microlens 20. When the microlenses 20 have shapes different from each other, the depth of the microlens 20 may take various values in a range of 3.2 to 15.4 μm for microlenses 20. Thereby, the optical properties of the optical element are improved.

The outer edges B of microlenses 20 are preferably in contact with each other. In other words, it is preferable that a flat portion (an exposed portion of the surface 10a) not be formed between microlenses 20. This is because when a flat portion is formed between microlenses 20, the intensity distribution of the reflected light of the optical element may not form a top hat shape. Thus, the aperture plane (the cross section perpendicular to the optical axis L1) of the microlens 20 is shaped to be a polygon. The filling rate of the microlenses 20 (the proportion of the microlenses 20 in the surface 10a of the substrate 10) is almost 100%.

As shown in FIG. 2, the amount of shift of the optical axis L1 of the microlens 20 from the centroid O is preferably 2.5 to 15% of the radius of the microlens 20. Here, the cross section of FIG. 2 is a cross section that passes through the apex P1 and the centroid O of the microlens 20 and is perpendicular to the surface 10a of the substrate 10. Hereinafter, such a cross section may be referred to as an "optical axis cross section." The centroid O is the centroid of the aperture plane. The amount of shift of the optical axis L1 from the centroid O is shown by the distance L6 from the intersection point P10 of the optical axis L1 and the surface 10a to the centroid O. The radius of the microlens 20 is shown by the distance r from the centroid O to a point P11 on the outer edge B. Here, the point P11 is the intersection point of the straight line extending from the centroid O toward the intersection point P10 and the outer edge B of the microlens 20.

The arithmetic average roughness Ra of the reflecting surface of the microlens is preferably 27 nm or less. In this case, the optical properties of the optical element 1 are further improved. Furthermore, there is no need to additionally provide a coating layer for reducing the arithmetic average roughness.

The aperture plane of the microlens 20 is preferably deviated from a regular polygon. Examples are shown in FIG. 3. In A OF FIG. 3, the aperture plane of the microlens 20 is in a shape deviated from a regular hexagon. Furthermore, the microlenses 20 have shapes different from each other. In this case, the lattice connecting the apices P1 of the microlenses 20 has a configuration deviated from a hexagonal lattice. In B OF FIG. 3, the aperture plane of the microlens 20 is in a shape deviated from a square. Furthermore, the microlenses 20 have shapes different from each other. In this case, the lattice connecting the apices P1 of the microlenses 20 has a configuration deviated from a square lattice. Here, "deviated from a regular polygon" means that the length of each side varies, the angle at each vertex is deviated from the angle of the regular polygon, etc. The shape of the aperture plane is not limited to these as a matter of course.

Here, although all the microlenses 20 included in the optical element 1 may have shapes different from each other, part of the microlenses 20 may be in the same shape. It is also possible for a structural unit composed of a plurality of microlenses 20 to be disposed repeatedly on the surface 10a. It is also possible for a microlens 20 in a regular shape to be formed to the extent that the optical properties of the embodiment are not impaired. Here, in the microlens 20 in a regular shape, the aperture plane is shaped to be a regular polygon. Furthermore, the reflecting surface 21 is a spherical surface and is symmetrical with respect to the optical axis L1.

In the optical element 1 according to the embodiment, since the microlens 20 has the shape described above, the optical properties are improved. In particular, the intensity distribution of the reflected light forms a top hat shape, and color unevenness is hardly found. The total amount of reflection (the sum of the intensities of the reflected light) is 4% or less of the intensity of the incident light, which is substantially equal to those of plastics. Therefore, the total amount of reflection is at an unproblematic level in practical terms. Hence, the moire when the optical element 1 is used for a display device can be suppressed, for example. By using the optical element 1 for illumination etc., the texture of them can be improved. The top hat shape refers to an intensity distribution that satisfies all the following conditions.

1. The reflectances in a prescribed angle range with the regular reflection position taken as the center are values in a range of plus or minus 12.0% of the average value of the reflectances in the prescribed angle range. Here, the prescribed angle range varies with the properties required for the optical element 1, and is, for example, larger than the regular reflection position −5° and smaller than the regular reflection position +5°. The prescribed angle range of Examples described later is this angle range.
2. The average value of the reflectances in a prescribed angle range is 7.0 times or more the average value of the reflectances outside the prescribed angle range.

Therefore, when the reflection intensity distribution forms a hot hat shape, the optical element 1 has the reflection property of reflecting a large amount of incident light in the front surface direction (at the same angle as the incident angle of the incident light).

<2. Configuration of the Master>

Figure 4:
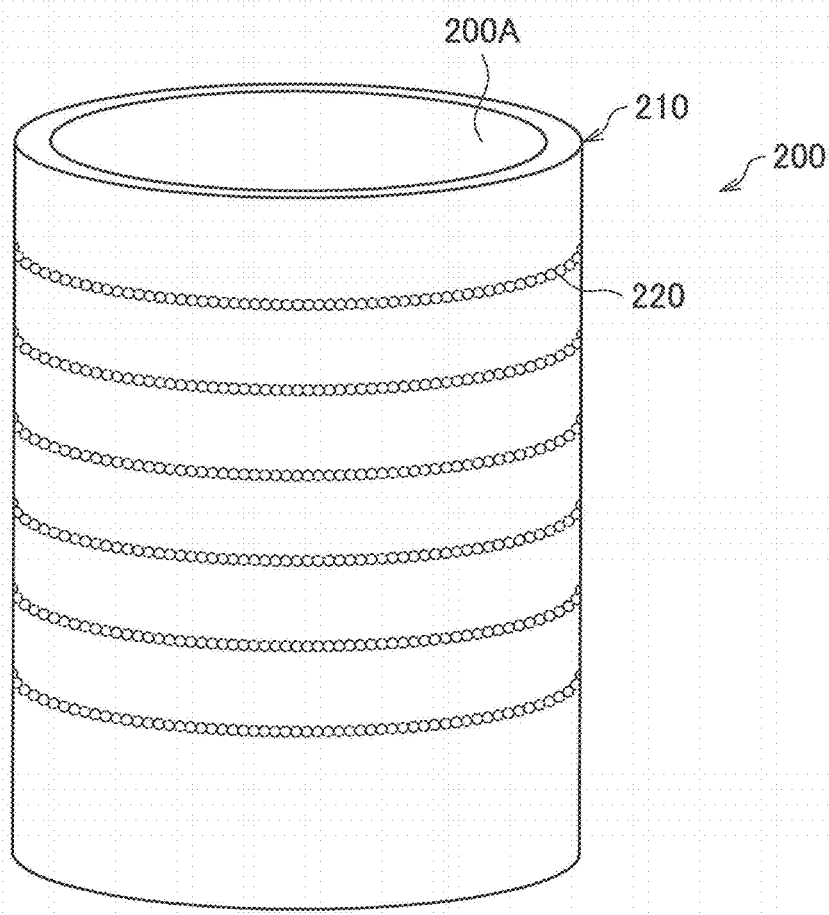
FIG. 4 is a perspective view showing the configuration of a master for manufacturing the optical element according to the embodiment.
Figure 5:
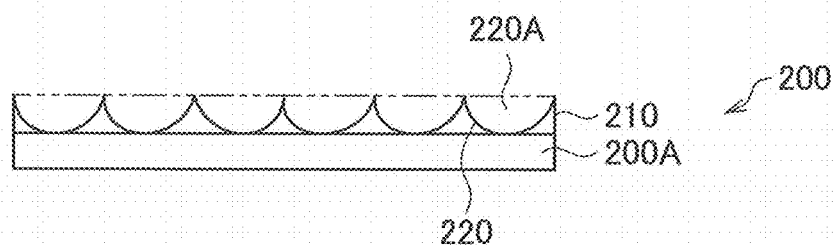
FIG. 5 is a cross-sectional view showing the detailed configuration of a transfer unit.

Next, the configuration of a master 200 used for the fabrication of the optical element 1 is described on the basis of FIG. 4 and FIG. 5. The master 200 includes a base material for the master 200A, a resist layer 210, and a plurality of transfer units 220 formed on the resist layer 210. In FIG. 4, part of the transfer units 220 formed on the resist layer 210 are schematically shown.

The base material for the master 200A is a member in a circular cylindrical or circular columnar shape. The material of the base material for the master 200A is not particularly limited, and a quartz glass ($SiO_2$) such as fused quartz glass or synthetic quartz glass or a metal such as stainless steel may be used. Thus, the master 200 forms what is called a roll master. The shape of the master 200 is not limited to roll shapes as a matter of course. For example, the master 200 may be in a flat plate shape. In this case, the base material for the master 200A is in a flat plate shape.

The resist layer 210 is formed on the surface of the base material for the master 200A. The resist layer 210 is a layer on which the transfer unit 220 is formed. The material that forms the resist layer 210 is not particularly limited to the extent that it can form a latent image pattern by laser light. For example, the material that forms the resist layer 210 is an organic-based resist. As the organic-based resist, for example, a novolac-based resist, a chemically amplified resist, or the like is given.

When the resist layer 210 is formed of an organic-based resist, the resist layer 210 may be formed by spin coating, slit coating, dip coating, spray coating, screen printing, or the like.

Figure 6:
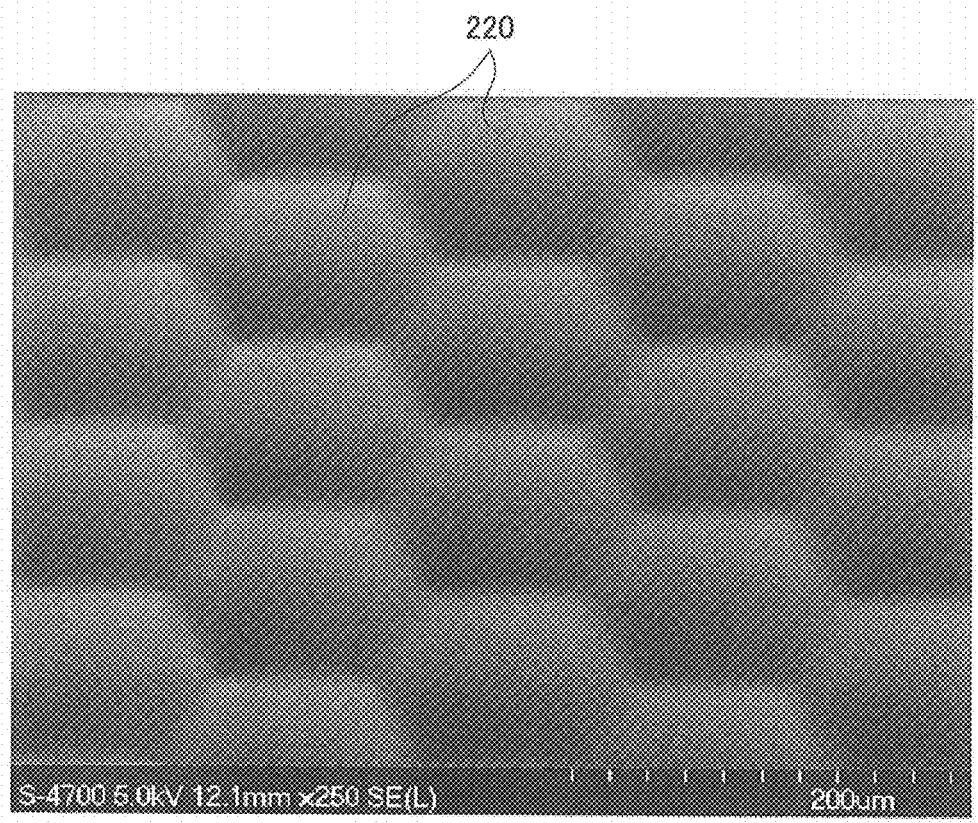
FIG. 6 is a SEM (scanning electron microscope) photograph showing the surface structure of the master.

The transfer unit 220 is formed in a large number on the surface of the resist layer 210 as shown in FIG. 4 and FIG. 5. The transfer unit 220 has the inverted shape of the microlens 20. Specifically, the transfer unit 220 has a hollow portion 220A having the same shape as the microlens 20. In the fabrication process of the optical element, the microlens 20 is formed by the hollow portion 220A being filled with resin. FIG. 6 is a SEM photograph showing the surface shape of the master 200. As shown in FIG. 6, a large number of transfer units 220 are formed on the surface of the master 200. Although the transfer unit 220 shown in FIG. 6 has a regular shape, the transfer unit 220 of the embodiment is in a distorted shape.

<3. Configuration of the Exposure Apparatus>

Figure 7:
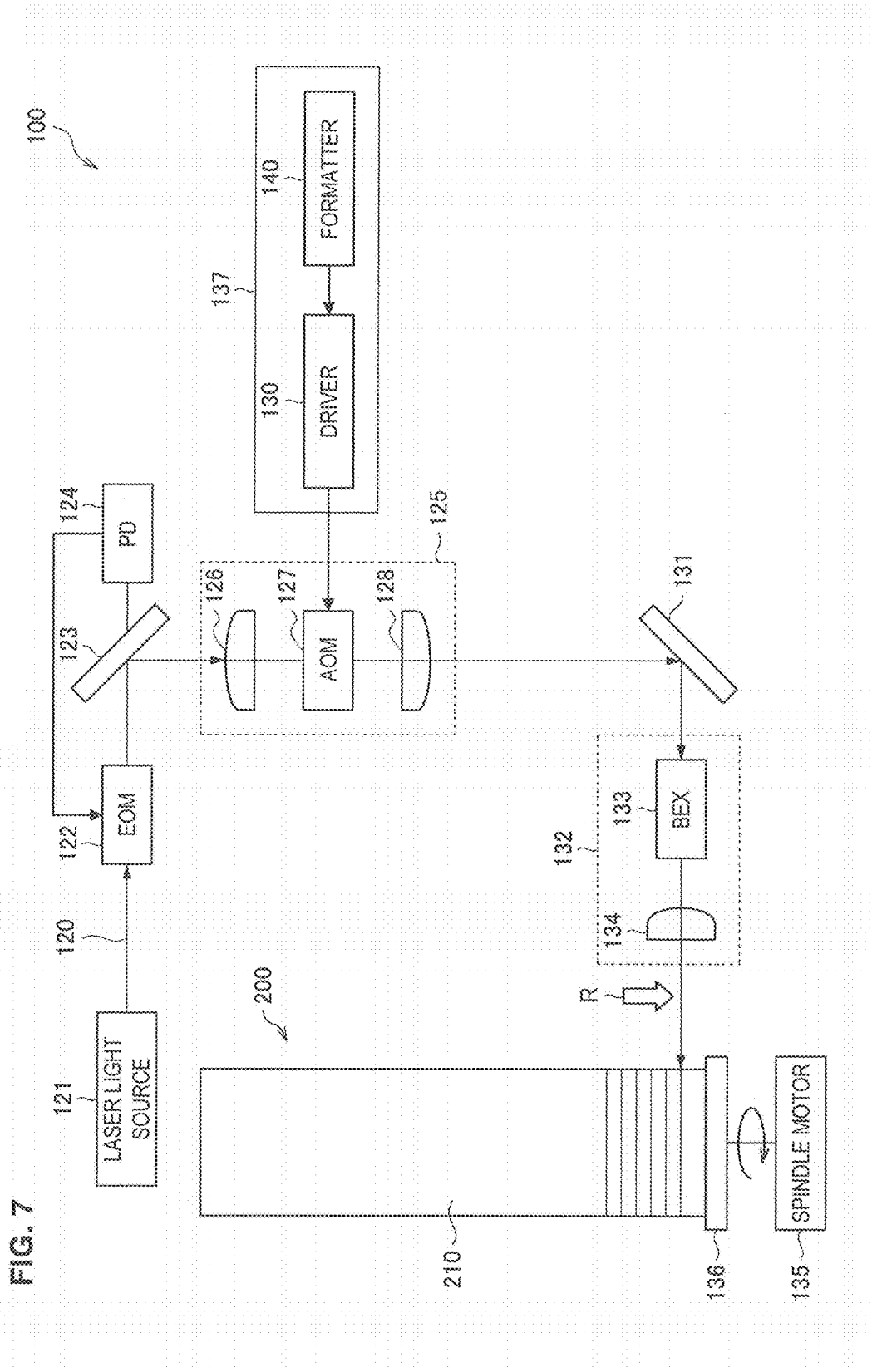
FIG. 7 is an illustration diagram showing the configuration of an exposure apparatus for forming the transfer unit on the master.
Figure 8:
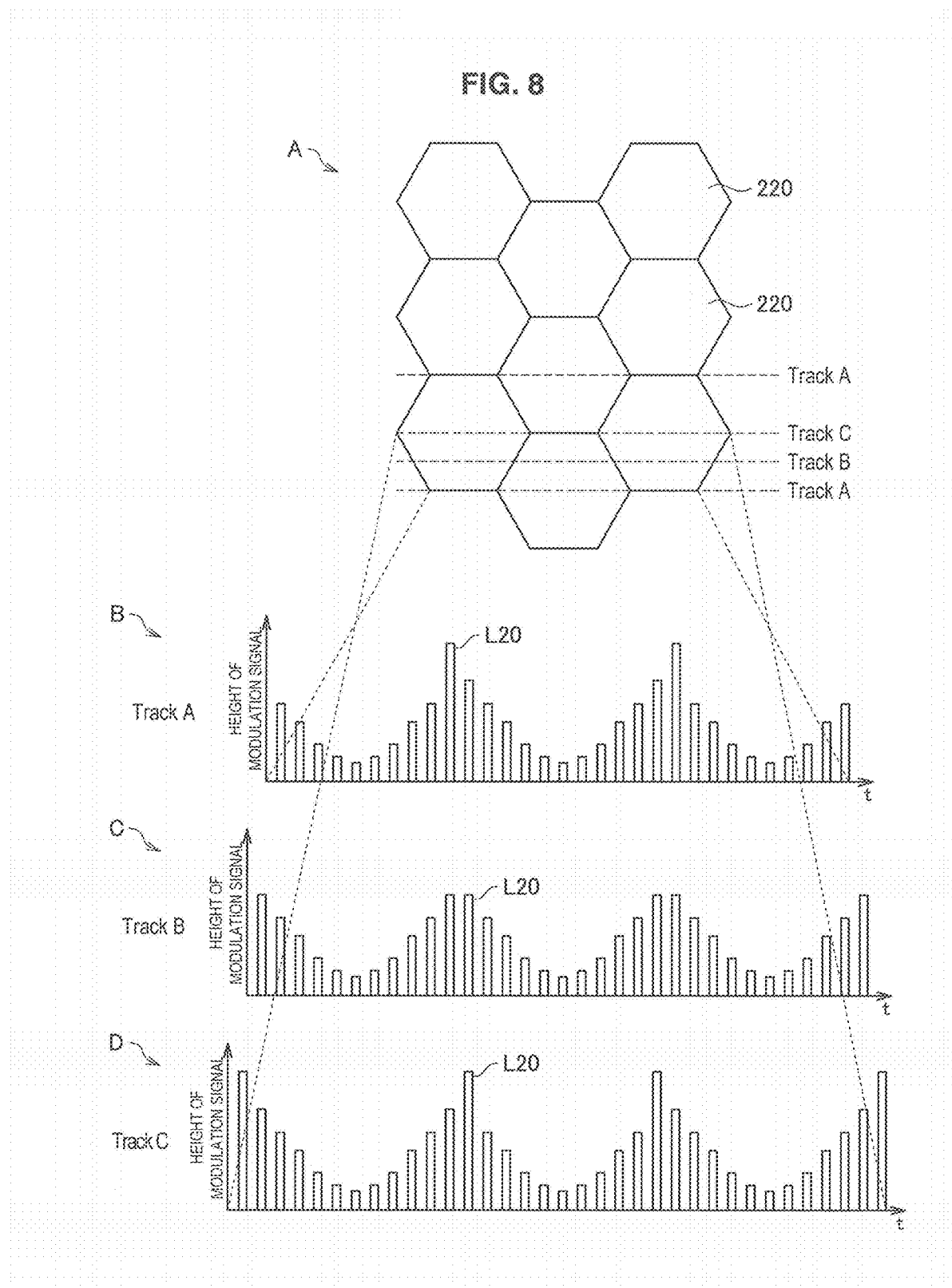
FIG. 8 include illustration diagram describing the principle of exposure by the exposure apparatus.

Next, the configuration of an exposure apparatus 100 is described on the basis of FIG. 7 and FIG. 8. The exposure apparatus 100 is an apparatus that forms the transfer unit 220 on the master 200. The exposure apparatus 100 includes a laser light source 121, an electro-optical element (electro-optical modulator; EOM) 122, a first mirror 123, a photodiode (PD) 124, a modulation optical system 125, a control mechanism 137, a second mirror 131, a movable optical table 132, a spindle motor 135, and a turntable 136. The master 200 is mounted on the turntable 136, and is rotatable.

The laser light source 121 is a light source that emits laser light 120, and is a solid-state laser, a semiconductor laser, or the like, for example. The wavelength of the laser light 120 emitted by the laser light source 121 is not particularly limited, and may be a wavelength in the blue light range of 400 nm to 500 nm, for example.

The laser light 120 emitted from the laser light source 121 goes straight while remaining a parallel beam, and enters the electro-optical element 122. The electro-optical element 122 performs the phase modulation of the laser light 120. The laser light 120 transmitted through the electro-optical element 122 is reflected at the first mirror 123, and is guided to the modulation optical system 125.

The first mirror 123 is formed of a polarization beam splitter, and has a function of reflecting one polarization component and transmitting the other polarization component. The polarization component transmitted through the first mirror 123 is received by the photodiode 124 to be photoelectrically converted. The light receiving signal photoelectrically converted by the photodiode 124 is inputted to the electro-optical element 122, and the electro-optical element 122 performs the phase modulation of the laser light 120 on the basis of the inputted light receiving signal.

The modulation optical system 125 includes a condensing lens 126, an acousto-optic element (acousto-optic modulator; AOM) 127, and a collimator lens 128.

In the modulation optical system 125, the laser light 120 is condensed to the acousto-optic element 127 made of glass (SiO$_2$) or the like by the light condensing lens 126. The laser light 120 is intensity-modulated and diverged by the acousto-optic element 127, and is then again made into a parallel beam by the collimator lens 128. The laser light 120 emitted from the modulation optical system 125 is reflected by the second mirror 131, and is guided onto the movable optical table 132 horizontally and parallel.

The control mechanism 137 includes a formatter 140 and a driver 130, and controls the application of the laser light 120. The formatter 140 generates a modulation signal that controls the application of the laser light 120, and the driver 130 controls the acousto-optic element 127 on the basis of the modulation signal generated by the formatter 140. Thereby, the application of the laser light 120 to the master 200 is controlled.

Here, the processing that the formatter 140 performs (exposure principle) is described in detail. The formatter 140, first, acquires an input image in which a plurality of microlenses 20 to be formed on the surface of the optical element 1 are depicted. In the input image, the three-dimensional shape of each microlens 20 is depicted, for example.

Subsequently, the formatter 140 sets a plurality of tracks on the surface of the master 200. Each track extends in the round direction of the master 200, and has the length of one round of the master 200. The tracks are arranged parallel to each other along the axial direction of the master 200. The spacing in the axial direction between tracks (feed pitch) is not particularly limited, and is set to, for example, approximately 1 μm. The feed pitch is preferably set so as to be half or less of the exposure beam diameter (the spot diameter of the laser light 120).

A of FIG. 8 is a plan view showing transfer units 220 having a regular shape. A of FIG. 8 shows also Tracks A to C for forming the transfer unit 220. In the transfer unit 220 shown in FIG. 8, the shape of the aperture plane (a plane corresponding to the aperture plane of the microlens 20) is a regular hexagon. The surface of the transfer unit 220 (a surface corresponding to the reflecting surface 21 of the microlens 20) is a spherical surface, and is symmetrical with respect to the optical axis. Although a transfer unit 220 in a regular shape is thus shown in FIG. 8 for ease of understanding, a transfer unit 220 in a distorted shape is formed in the embodiment.

The formatter 140 performs the following processing for each track. That is, the formatter 140 sets a plurality of exposure points on the track, and sets the height of the modulation signal at each exposure point on the basis of the input image. The formatter 140 does not select the height of the modulation signal from the two types of simple Low and High, but selects it from a plurality of levels of gradations. For example, the formatter 140 selects the height of the modulation signal from 500 levels of gradations (0 to 499 gradations). The levels of gradations are not limited to this as a matter of course.

Here, the height of the modulation signal corresponds to the intensity of the laser light 120. That is, the larger the height of the modulation signal is, the larger the intensity of the laser light 120 is. The larger the intensity of the laser light 120 is, the more (that is, to a deeper position) the resist layer 210 can be etched. Therefore, the formatter 140 sets the height of the modulation signal higher when the depth of the microlens 20 at each exposure point (the optical axis direction distance from the point corresponding to the exposure point to the outer edge B on the reflecting surface 21) is larger. Thus, the formatter 140 can select the intensity of the laser light 120 from a plurality of gradations.

The finer the gradations are, the smoother the surface of the microlens 20 can be made. For example, when a microlens 20 with a depth of 5 μm is fabricated with laser light 120 with 500 gradations, the difference in depth due to the difference of one gradation is 10 nm. That is, the formatter 140 can adjust the depth of the microlens 20 in units of 10 nm.

The formatter 140 preferably sets the position of the exposure point so that the spacing between adjacent exposure points (exposure pitch) is half or less of the exposure beam diameter (the spot diameter of the laser light 120). Thereby, spots of the laser light 120 overlap, and therefore the variation in exposure amount in the track direction is reduced. That is, the surface of the microlens 20 can be made smoother.

The formatter 140 generates a clock signal that synchronizes with the rotation of the spindle motor 135, and pulse-outputs the modulation signal of each exposure point to the driver 130 at an output timing synchronized with the clock signal. Thereby, the formatter 140 can reduce the gap between the exposure point set beforehand and the position to which the laser light 120 is actually applied. Furthermore, the formatter 140 can output the modulation signals for one track when the spindle motor 135 has made one rotation.

For example, the formatter 140 outputs the modulation signals for Track A in accordance with the timing chart shown in B of FIG. 8. Furthermore, the formatter 140 outputs the modulation signals for Track B in accordance with the timing chart shown in C of FIG. 8. Furthermore, the formatter 140 outputs the modulation signals for Track C in accordance with the timing chart shown in D of FIG. 8. The driver 130 controls the acousto-optic element 127 on the basis of the modulation signal. By the above processing, the exposure apparatus 100 pulse-applies the laser light 120.

Here, FIG. 8 show timing charts for forming a transfer unit 220 in a regular shape. The formatter 140 can form a transfer unit 220 in a distorted shape by altering the height of the modulation signal at each exposure point arbitrarily. The functions of the driver 130 and the formatter 140 are realized by cooperation of software and hardware. For example, the driver 130 and the formatter 140 may include a CPU (central processing unit), a ROM (read only memory), a RAM (random access memory), etc. which are mutually connected by a bridge, and may realize the functions mentioned above by means of these hardwares. For example, the CPU functions as an arithmetic processing unit and a control device, and controls the overall operation in the driver 130 and the formatter 140 in accordance with various programs. The ROM stores programs and processing parameters that the CPU uses, and the RAM temporarily stores programs used in the execution of the CPU, parameters that change as appropriate in the execution, etc. Thereby, the CPU can execute the functions of the driver 130 and the formatter 140.

The movable optical table 132 includes a beam expander (BEX) 133 and an objective lens 134. The laser light 120 guided to the movable optical table 132 is shaped into a desired beam shape by the beam expander 133, and is then applied to the resist layer 210 of the master 200 via the objective lens 134. The movable optical table 132 moves by one feed pitch in the arrow R direction (feed pitch direction) every time the master 200 makes one rotation. The master 200 is placed on the turntable 136. The spindle motor 135 rotates the turntable 136 to rotate the master 200.

Although not illustrated, the exposure apparatus 100 preferably performs focus control dynamically so that the laser light 120 always comes to a focus on the resist layer

210. Specifically, for the base material for the master 200A, the distance from the objective lens 134 to the base material for the master 200A fluctuates during rotation due to axial shifts of the rotation axis, the processing accuracy of the surface of the base material for the master 200A, etc. Thus, in order that the laser light 120 may always come to a focus on the resist layer 210 of the base material for the master 200A, the exposure apparatus 100 preferably detects the focus shift of the laser light 120 and controls the focus of the laser light 120 dynamically. As the method for detecting the focus shift of the laser light 120 with respect to the resist layer 210 on the base material for the master 200A, for example, a method of detecting the astigmatism of the reflected light of the laser light 120 applied to the resist layer 210 or the like may be used.

The parameters of each lens mentioned above (e.g. the numerical aperture, the depth of focus, etc.) may be set arbitrarily in a range in which the optical element 1 of the embodiment can be fabricated. For example, the depth of focus of the objective lens 134 may be set in a range of 10 to 20 μm. Since it is impossible to fabricate a microlens 20 with a depth of not less than the depth of focus, a depth of focus in accordance with the depth of the microlens 20 is set. The numerical aperture of the condensing lens 126 may be approximately 0.2, for example, and the numerical aperture of the objective lens 134 may be approximately 0.4. If the numerical aperture of each lens is too large, the depth of focus is reduced, and the depth of the microlens 20 is reduced. For example, when the numerical aperture of each lens is 0.9, the depth of focus is 1 μm. In this case, the depth of the microlens 20 is less than 1 μm undesirably.

<4. Method for Manufacturing the Optical Element>

Next, a method for manufacturing the optical element 1 is described. First, the master 200 is fabricated. Specifically, the base material for the master 200A in a circular cylindrical or circular columnar shape is prepared, and the resist layer 210 is formed on the peripheral surface of the base material for the master 200A.

Next, a latent image of the transfer unit 220 is formed on the resist layer 210 using the exposure apparatus 100. Specifically, the operator of the exposure apparatus 100 places the master 200 on the turntable 136. Subsequently, the operator inputs to the formatter 140 an input image in which a plurality of microlenses 20 to be formed on the surface of the optical element 1 are depicted. In the input image, for example, the three-dimensional shape of each microlens 20 is depicted.

Subsequently, the formatter 140 sets a plurality of tracks on the surface of the master 200. Each track extends in the round direction of the master 200, and has the length of one round of the master 200. The tracks are arranged parallel to each other along the axial direction of the master 200. The spacing in the axial direction between tracks (feed pitch) is not particularly limited, and is set to, for example, approximately 1 μm. The feed pitch is preferably set so as to be half or less of the exposure beam diameter (the spot diameter of the laser light 120).

The formatter 140 performs the following processing for each track. That is, the formatter 140 sets a plurality of exposure points on the track, and sets the height of the modulation signal at each exposure point on the basis of the input image. Here, the formatter 140 selects the height of the modulation signal from a plurality of levels of gradations. For example, the formatter 140 selects the height of the modulation signal from 500 levels of gradations (0 to 499 gradations).

Here, the formatter 140 preferably sets the position of the exposure point so that the spacing between adjacent exposure points (exposure pitch) is half or less of the exposure beam diameter (the spot diameter of the laser light 120). Thereby, spots of the laser light 120 overlap, and therefore the variation in exposure amount in the track direction is reduced. That is, the surface of the microlens 20 can be made smoother.

Subsequently, the laser light source 121 emits laser light 120 toward the electro-optical element 122. The electro-optical element 122 phase-modulates the laser light 120. The laser light 120 transmitted through the electro-optical element 122 is reflected at the first mirror 123, and is guided to the modulation optical system 125.

The first mirror 123 is formed of a polarization beam splitter, and has a function of reflecting one polarization component and transmitting the other polarization component. The polarization component transmitted through the first mirror 123 is received by the photodiode 124 to be photoelectrically converted. The light receiving signal photoelectrically converted by the photodiode 124 is inputted to the electro-optical element 122, and the electro-optical element 122 performs the phase modulation of the laser light 120 on the basis of the inputted light receiving signal.

The laser light 120 is condensed to the acousto-optic element 127 by the condensing lens 126. On the other hand, the formatter 140 generates a clock signal that synchronizes with the rotation of the spindle motor 135, and pulse-outputs the modulation signal of each exposure point to the driver 130 at an output timing synchronized with the clock signal. That is, the formatter 140 outputs the modulation signal at intervals of a prescribed time. The driver 130 controls the acousto-optic element 127 on the basis of the modulation signal generated by the formatter 140. The acousto-optic element 127 intensity-modulates and diverges the laser light 120.

After that, the laser light 120 is again made into a parallel beam by the collimator lens 128. The laser light 120 emitted from the modulation optical system 125 is reflected by the second mirror 131, and is guided onto the movable optical table 132 horizontally and parallel.

Figure 9:
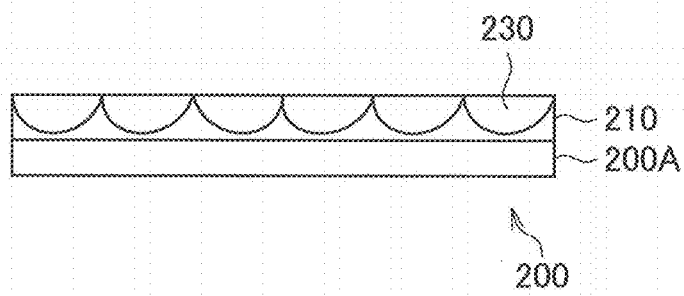
FIG. 9 is a cross-sectional view showing a situation where a latent image pattern is formed on a resist layer.

The laser light 120 guided to the movable optical table 132 is shaped into a desired beam shape by the beam expander 133, and is then applied to the resist layer 210 of the master 200 via the objective lens 134. The movable optical table 132 moves by one feed pitch in the arrow R direction (feed pitch direction) every time the master 200 makes one rotation. The spindle motor 135 rotates the turntable 136 at a constant rotation speed (e.g. 450 to 1800 rpm). By the above processing, the exposure apparatus 100 pulse-applies the laser light 120 to the resist layer 210 of the master 200. Thereby, the exposure apparatus 100 forms a plurality of latent images 230 (a latent image pattern) on the resist layer 210 of the master 200 as shown in FIG. 9. The latent image 230 has a shape substantially the same as that of the hollow portion 220A of the transfer unit 220. That is, the latent image 230 has the inverted shape of the microlens 20.

Subsequently, the resist layer 210 is developed to remove the latent image 230. Thereby, a plurality of transfer units 220 are formed on the resist layer 210. Subsequently, the inverted shape of the transfer unit 220 is transferred to the substrate 10.

Here, the method of the transfer is not particularly questioned. As an example of the transfer, a method using a photocurable resin will now be described. First, a photocurable resin before curing is applied onto the surface 10a of the substrate 10. The photocurable resin may be a UV curable resin such as an acrylic resin, for example. The photocurable resin may contain an initiator, filler, functional additive, solvent, inorganic material, pigment, antistatic agent, sensitizing dye, or others as necessary. The photocurable resin is applied onto the surface 10$a$ of the substrate 10 with a gravure coater, wire bar coater, die coater, or the like, for example.

Subsequently, the coating layer of the photocurable resin is pressed against the transfer unit 220 of the master 200 to charge the photocurable resin in the hollow portion 220A of the transfer unit 220. Subsequently, the photocurable resin is irradiated with light to cure the photocurable resin. Thereby, the inverted shape of the transfer unit 220 is transferred to the substrate 10. That is, a plurality of microlenses 20 are formed on the surface 10$a$ of the substrate 10. After that, the substrate 10 is peeled off from the master 200. By the above process, the optical element 1 is fabricated. Here, when the master 200 is a roll master, it is possible to fabricate the optical element 1 by roll-to-roll, and therefore an optical element 1 with a large area can be fabricated continuously. In the embodiment, the base material for the master 200A is not etched. Therefore, the base material for the master 200A can be reused by peeling off the resist layer 210 from the base material for the master 200A.

<5. Uses of the Optical Element>

The use of the optical element 1 is not particularly limited, and may be used as various optical parts. In particular, when the optical element 1 is used for a display device, the occurrence of moire can be suppressed. Furthermore, by using the optical element 1 for illumination etc., the texture of them can be improved.

EXAMPLES

Next, Examples and Comparative Examples of the present invention are described.

1. Example 1

1-1. Fabrication of the Optical Element

A commercially-available resist was formed as a film on a base material for the master 200A formed of a quartz glass plate using the dip method; thus, a resist layer 210 was formed. Subsequently, latent images 230 were formed on the resist layer 210 using the exposure apparatus 100 shown in FIG. 7. Here, as the laser light source 121, a blue semiconductor laser light source that emits laser light with a wavelength of 405 nm was used. The gradations of the laser light 120 were set to 500 gradations. The exposure beam diameter of the laser light was set to 2.5 μm, and both the feed pitch and the exposure pitch were set to 1 μm.

Subsequently, the resist layer 210 was developed to form a plurality of transfer units 220 on the resist layer 210. Here, a TMAH (tetramethylammonium hydroxide) aqueous solution was used for the development. The transfer unit 220 has the inverted shape of the microlens 20 described later.

Figure 10:
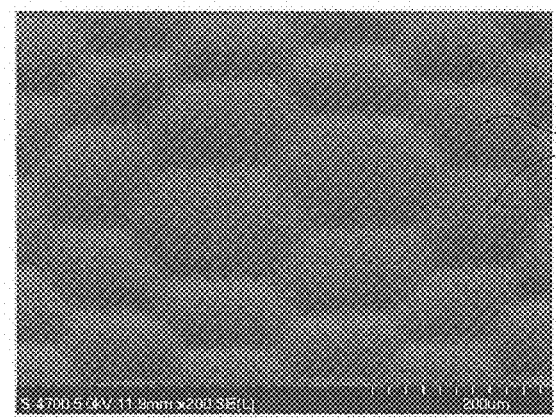
FIG. 10 is a SEM photograph showing the surface shape of the optical element according to Example 1.

Subsequently, the inverted shape of the transfer unit 220 was transferred to a substrate 10; thus, an optical element 1 was fabricated. Here, the method of the transfer was a method using a photocurable resin. A PET film was used as the substrate 10, and an acrylic-based UV curable resin was used as the photocurable resin. By the above processing, the optical element 1 according to Example 1 was fabricated. In the optical element 1 according to Example 1, the structural unit of microlenses 20 shown in FIG. 10 is repeated. FIG. 10 is a SEM photograph showing the surface shape of the optical element 1 according to Example 1. The scanning electron microscope (SEM) used in the Example was S-4700 manufactured by Hitachi, Ltd. Thus, in Example 1, the aperture plane of the microlens 20 is in a shape deviated from a regular hexagon (that is, a distorted hexagon). The outer edges of microlenses 20 are in contact with each other.

1-2. Measurement of the Pitch and the Depth

When the pitch and the depth of all the microlenses 20 constituting one structural unit were measured with the SEM, the pitch was various values in a range of 126 to 228 μm. The depth was various values in a range of 5.2 to 7.2 μm.

1-3. Measurement of the Amount of Shift of the Optical Axis

Figure 19:
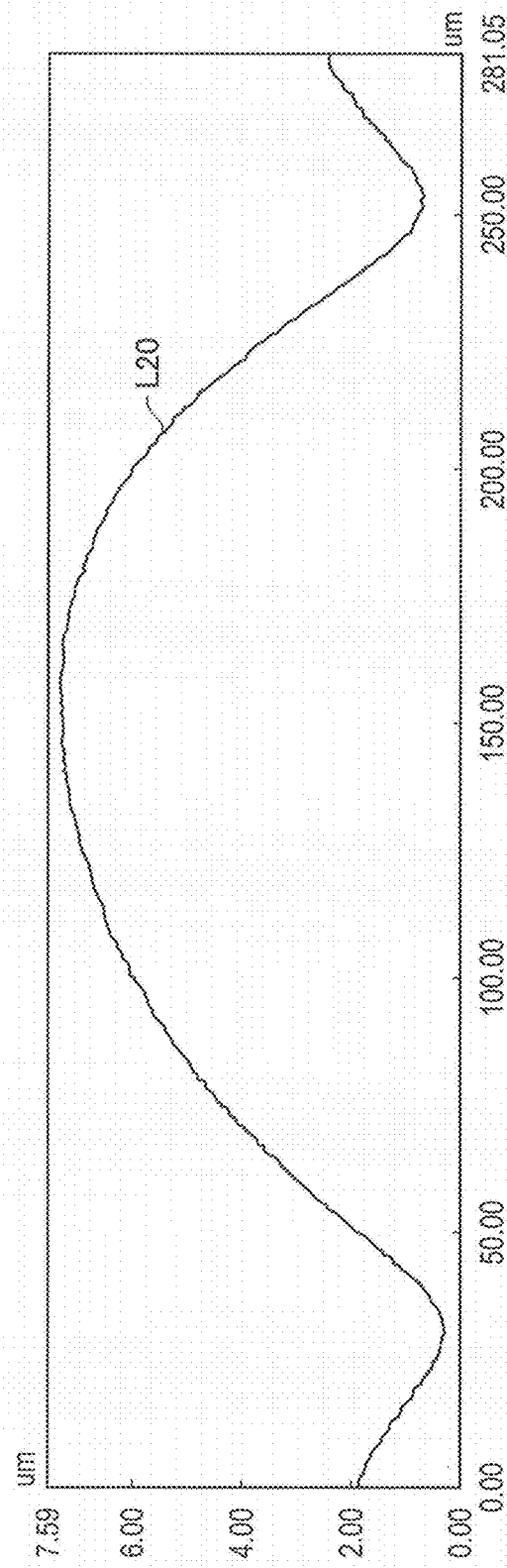
FIG. 19 is a graph showing the cross-sectional shape of a microlens according to Example 1.
Figure 20:
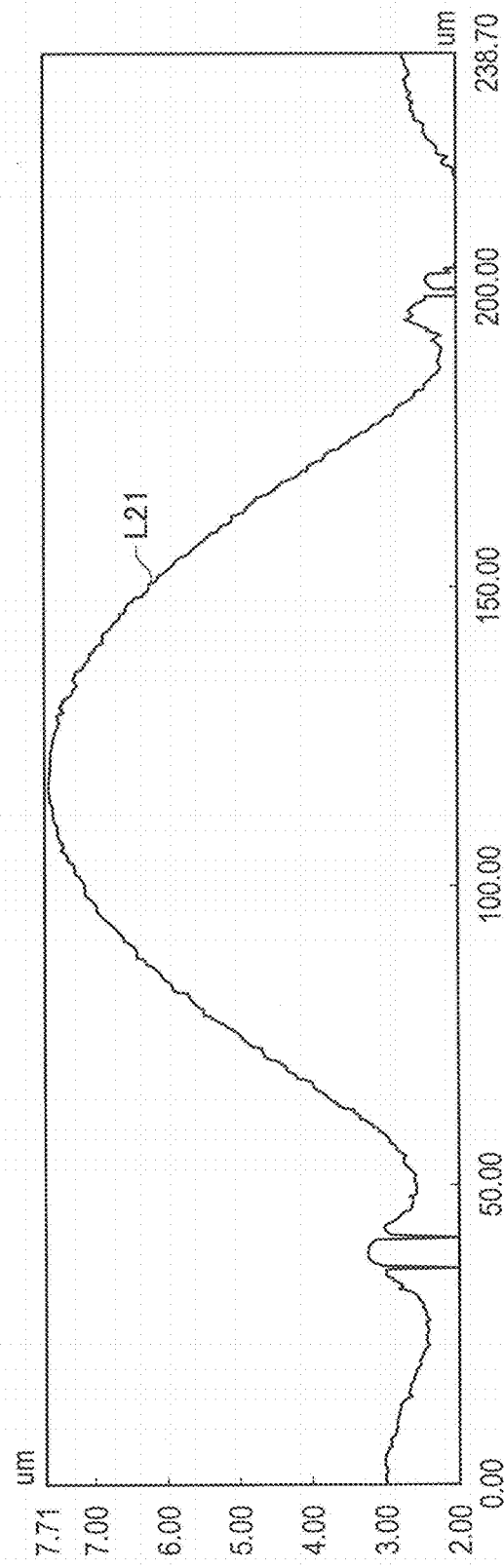
FIG. 20 is a graph showing the cross-sectional shape of a microlens according to Example 1.

The optical axis cross-sectional shape of the microlens 20 was measured with a laser microscope (VK-X 200 manufactured by Keyence Corporation). Based on the measurement results, the amount of shift of the optical axis L1 of the microlens 20 from the centroid O of the microlens 20 was measured. The measurement was performed on all the microlenses 20 constituting one structural unit. Consequently, the amount of shift was values in a range of 2.5% to 15% of the radius of the microlens 20. Graphs L20 and L21 of FIG. 19 and FIG. 20 show examples of the optical axis cross-sectional shape. The horizontal axis of FIG. 19 and FIG. 20 represents the distance from each point on the intersection line of the optical axis cross section and the surface 10$a$ of the substrate 10 to a reference point set on the intersection line. The vertical axis represents the distance from the surface 10$a$ of the substrate 10 to each point on the reflecting surface 21.

Next, the arithmetic average roughness Ra of a reflecting surface of the microlens was measured. Specifically, a microlens 20 was selected as a measuring object. Measuring ranges of lengths of 10 μm and 100 μm with the apex of the microlens 20 taken as the center were set. The arithmetic average roughness Ra was measured in the measuring ranges. VertScan manufactured by Ryoka Systems Inc. was used for the measurement.

1-4. Measurement of the Reflection Properties

Figure 22:
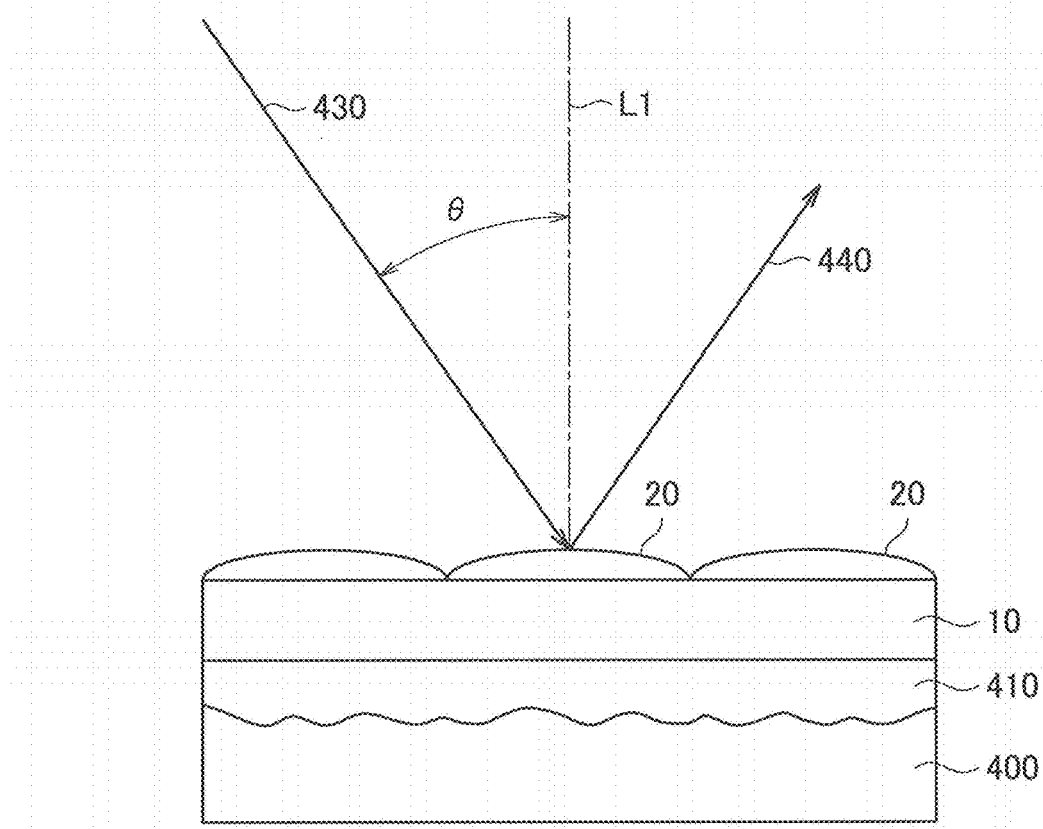
FIG. 22 is an illustration diagram schematically showing a method for measuring the reflection properties of the optical element.
Figure 23:
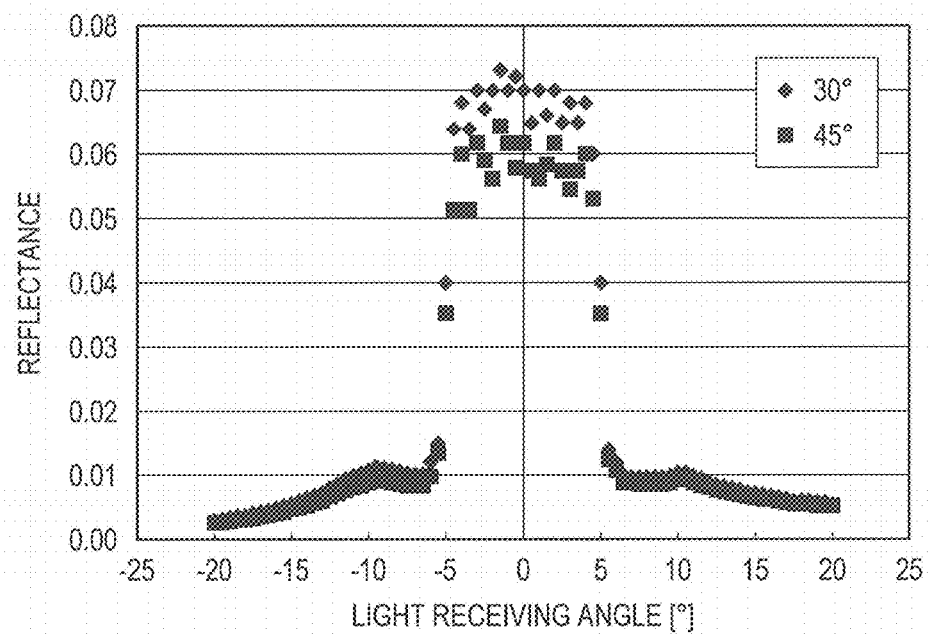
FIG. 23 is a graph showing the reflection properties of the optical element according to Example 1.

The reflection properties of the optical element 1 were measured and evaluated by the following method. A goniophotometer manufactured by Lambda Vision Inc. was used for the measurement. The measurement was performed in the following sequence. As shown in FIG. 22, the optical element 1 was placed on a test stand 400 via an adhesive layer 410. A transmitter was placed at a position inclined from the optical axis L1 by θ (=30°), and measuring light was applied from the transmitter to the optical element 1. The wavelength of the measuring light was set to 532 nm. On the other hand, a photoreceiver was placed at a position inclined from the optical axis L1 by θ (=30°) (the regular reflection position=0°), and was made to receive the measuring light. The photoreceiver was moved in a range of plus or minus 20° from the regular reflection position and is made to receive the measuring light at each position. The reflectance (%) was measured on the basis of the intensity of the measuring light applied by the transmitter and the intensity of the measuring light received by the photoreceiver. The value of θ was set to 45° and similar processing was performed. The results are shown in FIG. 23. The horizontal axis of FIG. 23 represents the light receiving angle, that is, the position of the photoreceiver when the regular reflection position is taken as a reference (=0°). The vertical axis represents the reflectance (%).

As shown in FIG. 23, when the position of the transmitter was a position at 30° from the optical axis L1, the following measurement results were obtained. That is, the average value of reflectance was 0.068 in a prescribed angle range of larger than the regular reflection position −5° and smaller than the regular reflection position +5°. In the prescribed angle range, the reflectance was values in a range of −5.9 to +7.4% of the average value. In the range outside the prescribed angle range, the average value of reflectance was 0.009. Thus, the average value in the prescribed angle range was 7.6 times the average value in the range outside the prescribed angle range.

When the position of the transmitter was a position at 45° from the optical axis L1, the following measurement results were obtained. That is, the average value of reflectance was 0.058 in a prescribed angle range of larger than the regular reflection position −5° and smaller than the regular reflection position +5°. In the prescribed angle range, the reflectance was values in a range of −11.7 to +10.3% of the average value. In the range outside the prescribed angle range, the average value of reflectance was 0.009. Thus, the average value in the prescribed angle range was 7.5 times the average value in the range outside the prescribed angle range.

Whether the reflection intensity distribution formed a top hat shape or not was evaluated by decision criteria 1 and 2 described above. Consequently, it was revealed that the reflection intensity distribution formed a top hat shape. That is, the evaluation of the top hat shape was classified as "good." In the case where, in decision criterion 1, the reflectances in a prescribed angle range with the regular reflection position taken as the center were within plus or minus 10.0% of the average value in the prescribed angle range, the evaluation of the top hat shape was classified as "very good." In the case where at least one of decision criteria 1 and 2 was not satisfied, the evaluation of the top hat shape was classified as "less good."

The total amount of reflection, that is, the sum of the intensities of the reflected light was measured, and the proportion to the intensity of the incident light was measured. Consequently, the total amount of reflection was 3.7% relative to the intensity of the incident light.

1-5. Color Unevenness Evaluation

Next, the presence or absence of color unevenness was observed by visual inspection. Specifically, the case where color unevenness was not observed at all was evaluated as "very good," the case where color unevenness was observed a little but there was no problem in practical terms was evaluated as "good," and the case where color unevenness was able to be observed clearly and there was a problem in practical terms was evaluated as "less good." In Example 1, the evaluation was "very good."

2. Example 2

Figure 11:
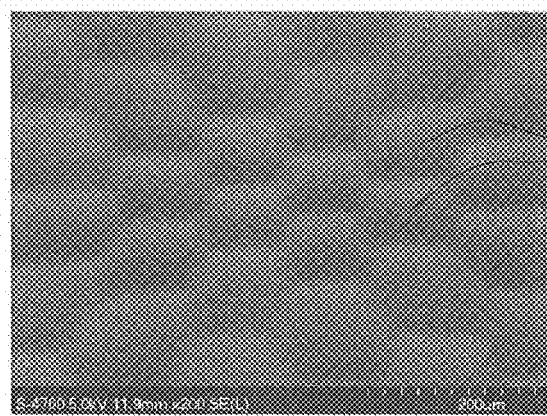
FIG. 11 is a SEM photograph showing the surface shape of the optical element according to Example 2.

An optical element 1 having the structural unit shown in FIG. 11 was fabricated by performing processing similar to that of Example 1. Also in Example 2, the aperture plane of the microlens 20 was shaped to be a distorted regular hexagon. Property evaluation similar to that of Example 1 was performed on the optical element 1 fabricated in Example 2. The results are shown in Table 1 collectively.

3. Example 3

Figure 12:
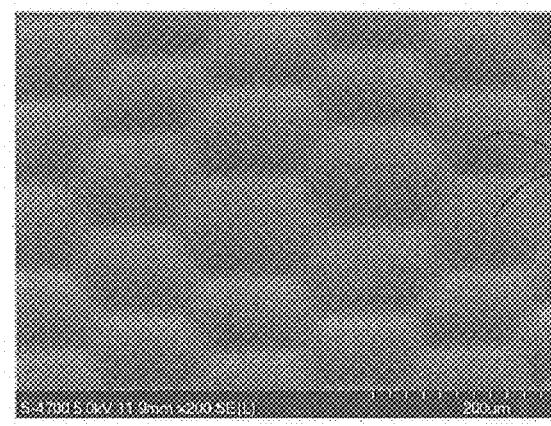
FIG. 12 is a SEM photograph showing the surface shape of the optical element according to Example 3.

An optical element 1 having the structural unit shown in FIG. 12 was fabricated by performing processing similar to that of Example 1. Also in Example 3, the aperture plane of the microlens 20 was shaped to be a distorted regular hexagon. Property evaluation similar to that of Example 1 was performed on the optical element 1 fabricated in Example 3. The results are shown in Table 1 collectively.

4. Example 4

Figure 13:
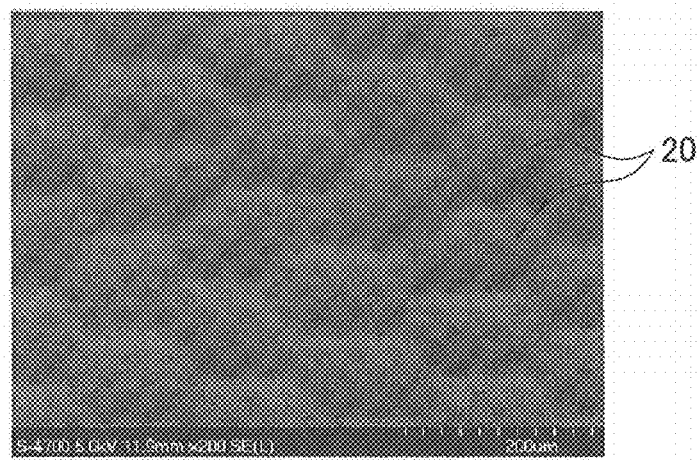
FIG. 13 is a SEM photograph showing the surface shape of the optical element according to Example 4.

An optical element 1 having the structural unit shown in FIG. 13 was fabricated by performing processing similar to that of Example 1. Also in Example 4, the aperture plane of the microlens 20 was shaped to be a distorted regular hexagon. Property evaluation similar to that of Example 1 was performed on the optical element 1 fabricated in Example 4. The results are shown in Table 1 collectively.

5. Example 5

Figure 14:
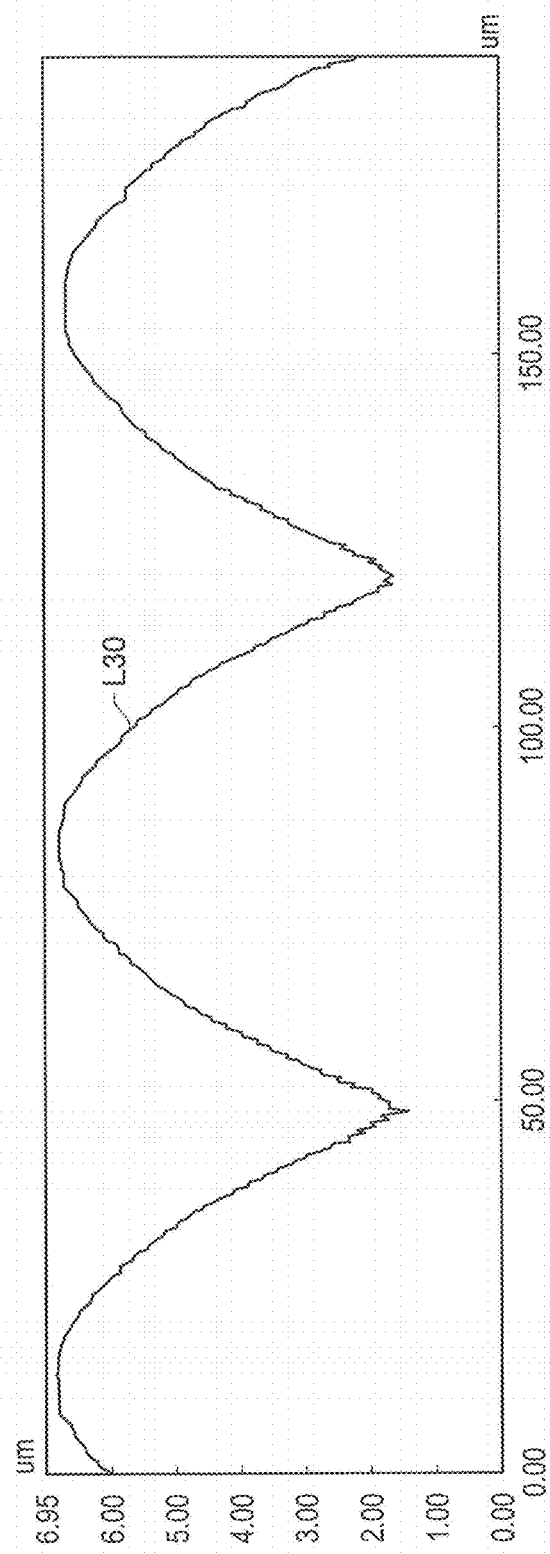
FIG. 14 is a graph showing the cross-sectional shape of a microlens according to Example 5.

An optical element 1 having the shape shown in Table 1 was fabricated by performing processing similar to that of Example 1. Graph L30 of FIG. 14 shows an example of the optical axis cross-sectional shape according to Example 5. The meanings of the vertical axis and the horizontal axis of FIG. 14 are the same as those of FIG. 19. Also in Example 5, the aperture plane of the microlens 20 was shaped to be a distorted regular hexagon. Property evaluation similar to that of Example 1 was performed on the optical element 1 fabricated in Example 5. The results are shown in Table 1 collectively.

6. Example 6

Figure 15:
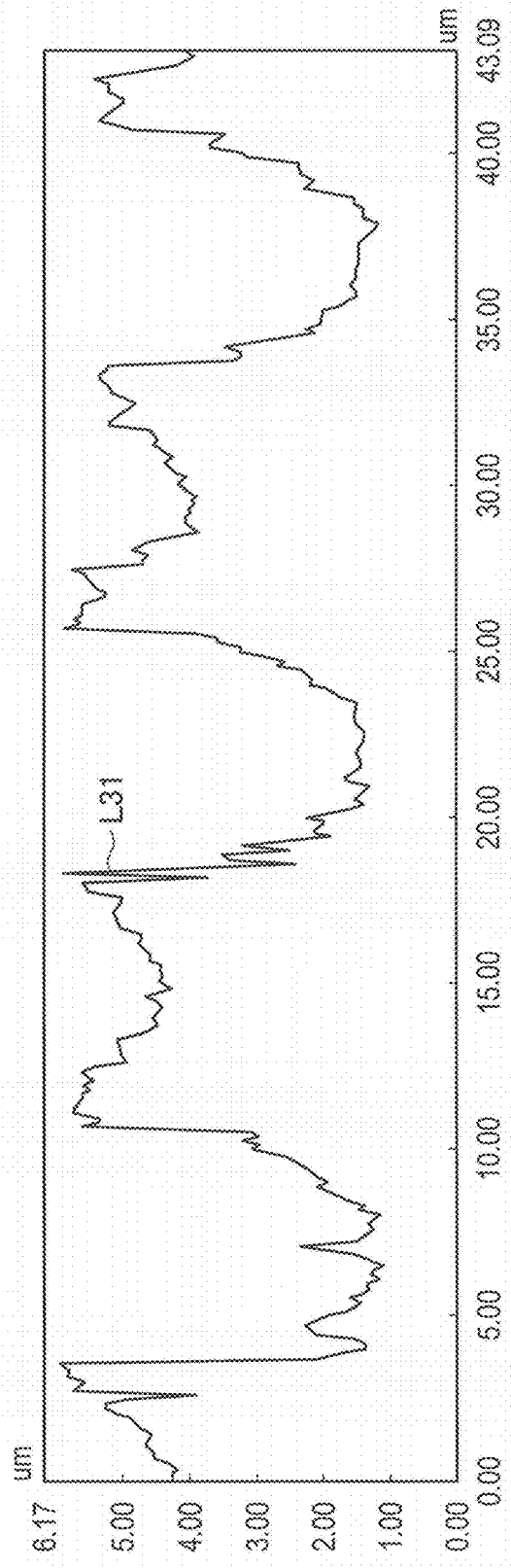
FIG. 15 is a graph showing the cross-sectional shape of a microlens according to Example 6.

An optical element 1 having the shape shown in Table 1 was fabricated by performing processing similar to that of Example 1. Graph L31 of FIG. 15 shows an example of the optical axis cross-sectional shape according to Example 6. The meanings of the vertical axis and the horizontal axis of FIG. 15 are the same as those of FIG. 19. As is clear from FIG. 15, the microlens 20 of Example 6 is a concave lens. Also in Example 6, the aperture plane of the microlens 20 was shaped to be a distorted regular hexagon. Property evaluation similar to that of Example 1 was performed on the optical element 1 fabricated in Example 6. The results are shown in Table 1 collectively.

7. Example 7

Figure 16:
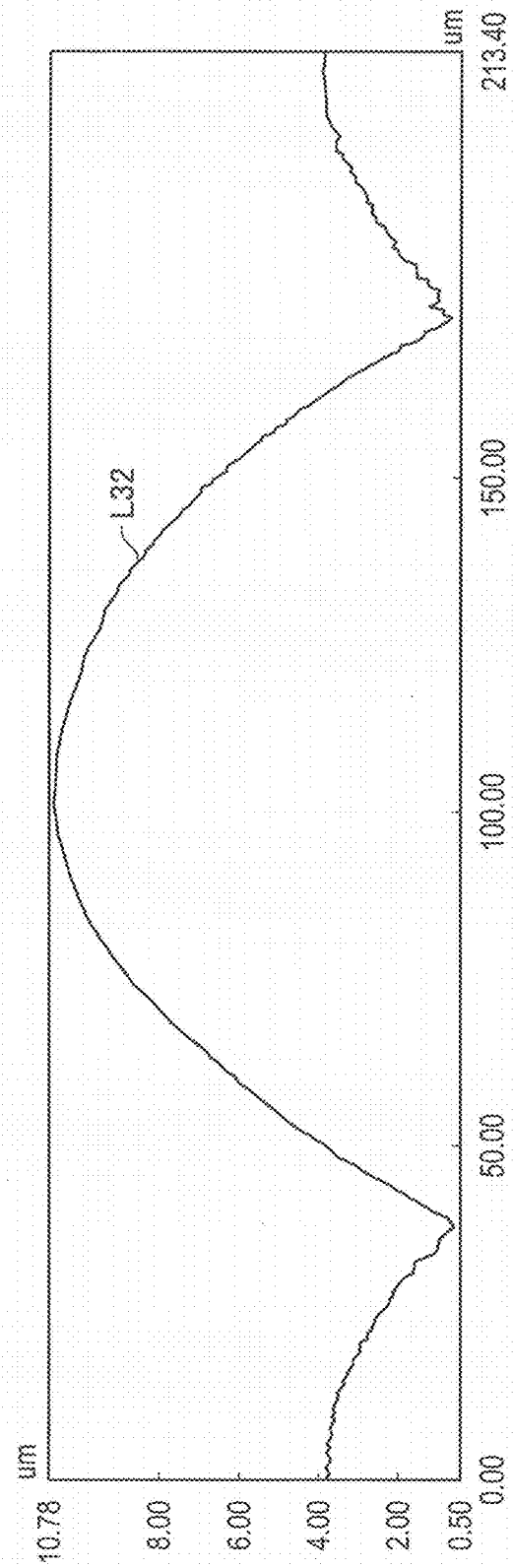
FIG. 16 is a graph showing the cross-sectional shape of a microlens according to Example 7.

An optical element 1 having the shape shown in Table 1 was fabricated by performing processing similar to that of Example 1. Graph L32 of FIG. 16 shows an example of the optical axis cross-sectional shape according to Example 7. The meanings of the vertical axis and the horizontal axis of FIG. 16 are the same as those of FIG. 19. Also in Example 7, the aperture plane of the microlens 20 was shaped to be a distorted regular hexagon. Property evaluation similar to that of Example 1 was performed on the optical element 1 fabricated in Example 7. The results are shown in Table 1 collectively.

8. Comparative Example 1

Figure 17:
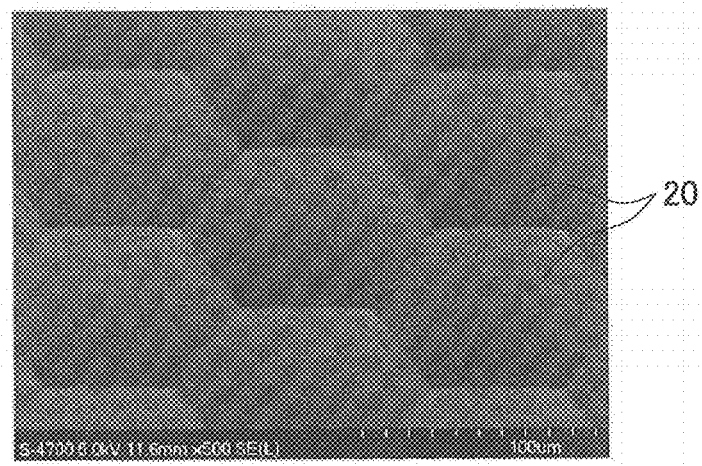
FIG. 17 is a SEM photograph showing the surface shape of the optical element according to Comparative Example 1.
Figure 21:
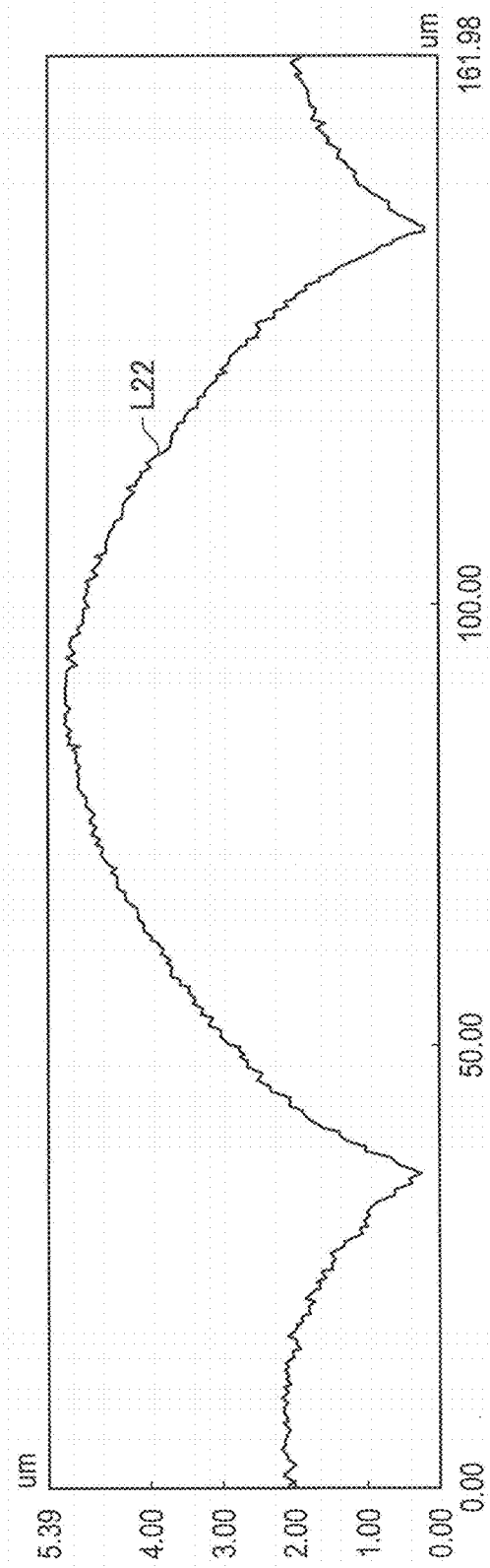
FIG. 21 is a graph showing the cross-sectional shape of a microlens according to Comparative Example 1.
Figure 24:
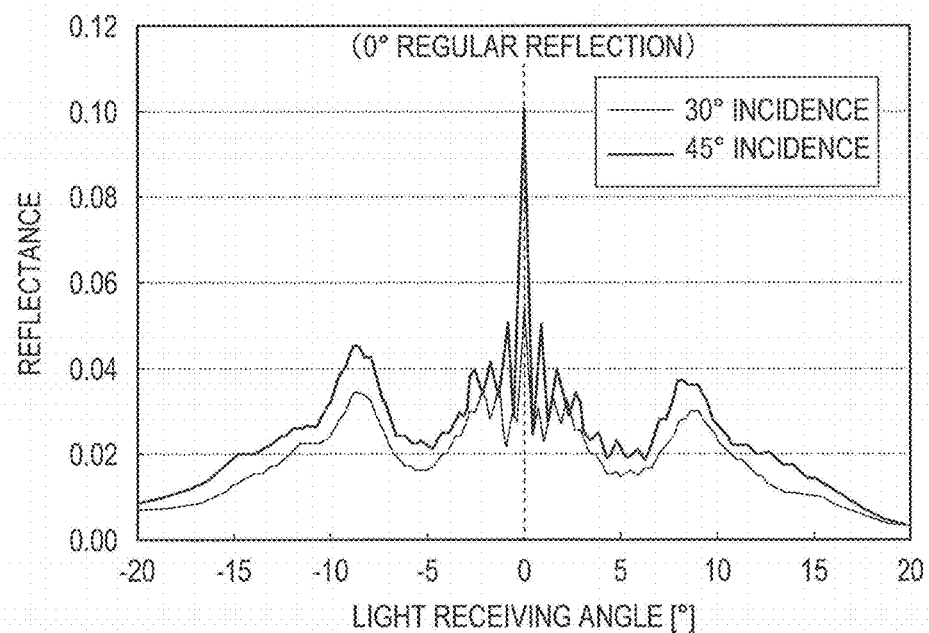
FIG. 24 is a graph showing the reflection properties of the optical element according to Comparative Example 1.

An optical element 1 having the structural unit shown in FIG. 17 was fabricated by performing processing similar to that of Example 1. However, in Comparative Example 1, the gradations of the laser light 120 were set to 200 gradations. Furthermore, in Comparative Example 1, a microlens 20 in a regular shape was fabricated. That is, the aperture plane of the microlens 20 was shaped to be a regular hexagon. Furthermore, the reflecting surface 21 of the microlens 20 was made a spherical surface, and was shaped to be symmetrical with respect to the optical axis L1. Property evaluation similar to that of Example 1 was performed on the optical element 1 fabricated in Comparative Example 1. Graph L22 shown in FIG. 21 shows an example of the optical axis cross-sectional shape of the microlens 20 fabricated in Comparative Example 1. The meanings of the vertical axis and the horizontal axis of FIG. 21 are the same as those of FIG. 19. FIG. 24 is a graph showing the reflection intensity distribution of Comparative Example 1. The meanings of the vertical axis and the horizontal axis are the same as those of FIG. 23. As is clear from FIG. 24, the reflection property distribution of Comparative Example 1 did not form a top hat shape. The evaluation results are shown in Table 1 collectively.

9. Comparative Example 2

Figure 18:
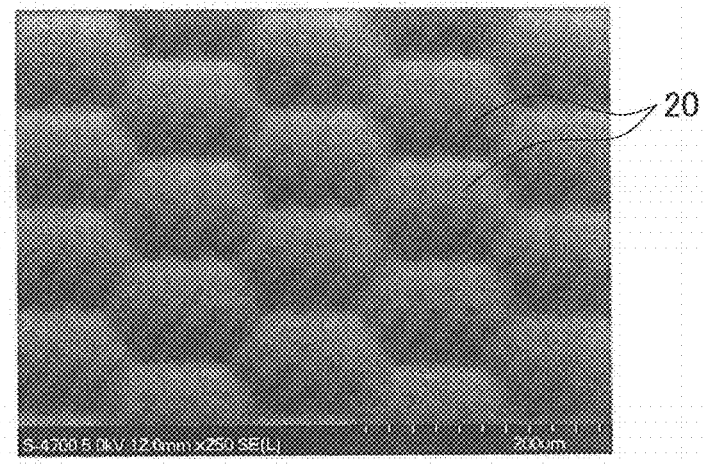
FIG. 18 is a SEM photograph showing the surface shape of the optical element according to Comparative Example 2.

An optical element 1 having the structural unit shown in FIG. 18 was fabricated by performing processing similar to that of Example 1. However, in Comparative Example 2, a microlens 20 in a regular shape was fabricated. That is, the aperture plane of the microlens 20 was shaped to be a regular hexagon. Furthermore, the reflecting surface 21 of the microlens 20 was made a spherical surface, and was shaped to be symmetrical with respect to the optical axis L1. Property evaluation similar to that of Example 1 was performed on the optical element 1 fabricated in Comparative Example 2. The evaluation results are shown in Table 1 collectively.

optical axis is various values in a range of 2.5 to 15%. In Examples 1 to 7, all the reflection intensity distributions formed a top hat shape, and color unevenness was hardly observed. Furthermore, the total amount of reflection was in a range of 4% or less. Thus, good optical properties were obtained.

On the other hand, in Comparative Example 1, since the gradations of the laser light 120 were lower than those of the other examples, the arithmetic average roughness Ra was definitely larger than those of the other examples. Furthermore, the microlens 20 is not in a distorted shape. Consequently, the reflection intensity distribution did not form a top hat shape, and color unevenness was great. In particular, the color unevenness of Comparative Example 1 was greater also than that of Comparative Example 2. In Comparative Example 2, although the reflection intensity distribution formed a top hat shape, color unevenness was great. A reason why color unevenness was found in Comparative Examples 1 and 2 is that the microlens 20 has a regular shape. That is, when the microlens 20 has a regular shape, the effect of interference of light appears significantly, and the reflected light is separated into rainbow colors. Hence, color unevenness occurs. Reasons why color unevenness was particularly large in Comparative Example 1 include, in addition to the above reason, that the arithmetic average roughness Ra is outstandingly large. Thus, it has been found that the optical element 1 according to the embodiment has good optical properties.

Heretofore, preferred embodiments of the present invention have been described in detail with reference to the appended drawings, but the present invention is not limited thereto. It should be understood by those skilled in the art that various changes and alterations may be made without departing from the spirit and scope of the appended claims.

TABLE 1

| | Example 1 | Example 2 | Example 3 | Example 4 | Example 5 | Example 6 | Example 7 | Comparative Example 1 | Comparative Example 2 |
|---|---|---|---|---|---|---|---|---|---|
| Pitch (μm) | 126-228 | 121-196 | 141-197 | 114-189 | 54-78 | 10-18 | 108-147 | 108 | 142 |
| Depth (μm) | 5.2-7.2 | 4.9-6.9 | 5.4-7.0 | 6.0-6.6 | 4.2-5.9 | 3.2-5.4 | 8.9-15.4 | 5.3 | 7.2 |
| Amount of shift of optical axis (%) | 2.5-15 | 2.5-15 | 2.5-15 | 2.5-15 | 2.5-15 | 2.5-4.5 | 2.5-9.6 | Less than 2.5 | Less than 2.5 |
| Ra of 10 μm (nm) | 3.3 | 4.6 | 3.9 | 3.6 | 2.7 | 7.7 | 2.4 | 9.8 | 2.6 |
| Ra of 100 μm (nm) | 15.4 | 18.9 | 17.1 | 17.5 | 13.2 | 27 | 11.2 | 41 | 12.8 |
| Total amount of reflection (%) | 3.7 | 3.4 | 4 | 3.3 | 3.2 | 3.0 | 2.8 | 5.1 | 3.1 |
| Top hat shape | Good | Good | Good | Good | Good | Good | Good | Less good | Very good |
| Color unevenness | Very good | Good | Very good | Very good | Good | Good | Good | Less good | Less good |

10. Property Evaluation

In the optical elements 1 according to Examples 1 to 7, the aperture plane of the microlens 20 is shaped to be a distorted hexagon. Furthermore, the reflecting surface is an aspherical surface, and is asymmetrical with respect to the optical axis L1. Furthermore, the pitch is various values in a range of 10 to 230 μm, and the depth is various values in a range of 3.2 to 15.4 μm. Moreover, the outer edges of microlenses 20 are in contact with each other, and the amount of shift of the

What is claimed is:
1. An optical element comprising:
a substrate; and
a plurality of microlenses formed on the substrate,
wherein a reflecting surface of each microlens of the plurality of microlenses is an aspherical surface and asymmetrical with respect to an optical axis of the microlens,
wherein the plurality of microlenses have shapes different from each other, wherein each outer edge of each microlens is in contact with a respective outer edge of an adjacent microlens of the plurality of microlenses, wherein a pitch between adjacent ones of the plurality of microlenses is 10 to 230 μm, and wherein a depth of each microlens is 3.2 to 15.4 μm.

2. The optical element according to claim 1, wherein the pitch between adjacent ones of the plurality of microlenses is different between various combinations of adjacent ones of the plurality microlenses.

3. The optical element according to claim 1, wherein the depth of each microlens is different between the plurality of microlenses.

4. The optical element according to claim 1, wherein an aperture plane of each microlens is in a shape deviated from a regular polygon.

5. The optical element according to claim 4, wherein the aperture plane of each microlens is in a shape deviated from a regular hexagon.

6. The optical element according to claim 4, wherein the aperture plane of each microlens is in a shape deviated from a square.

7. The optical element according to claim 1, wherein an arithmetic average roughness Ra of the reflecting surface of each microlens is 27 nm or less.

8. The optical element according to claim 1, wherein an amount of shift of the optical axis of each microlens from a centroid of the microlens is 2.5% to 15% of a radius of the microlens.

9. The optical element according to claim 1, wherein an intensity distribution of reflected light forms a top hat shape.

10. The optical element according to claim 9, wherein a sum of intensities of the reflected light is 4% or less of an intensity of incident light.

11. A display device comprising the optical element according to claim 1.

12. A master for manufacturing the optical element according to claim 1, the master comprising:
   a base material for the master; and
   a resist layer formed on the base material for the master,
   wherein a plurality of transfer units each having an inverted shape of a respective microlens of the plurality of microlenses are formed on the resist layer.

13. A method for manufacturing an optical element for manufacturing the optical element according to claim 1, the method comprising:
   forming a resist layer on a base material for a master;
   pulse-applying laser light to the resist layer to form a latent image pattern having an inverted shape of each microlens of the plurality of microlenses on the resist layer;
   developing the resist layer to form a transfer unit having the inverted shape of each microlens of the plurality of microlenses on the resist layer; and
   transferring the inverted shape of the transfer unit to the substrate.

14. The optical element according to claim 1, wherein each outer edge of each microlens is in contact along substantially its entire length with the respective outer edge of the adjacent microlens.

* * * * *